(12) United States Patent
Amador et al.

(10) Patent No.: US 7,071,013 B2
(45) Date of Patent: Jul. 4, 2006

(54) FIXTURE AND METHOD FOR UNIFORM ELECTROLESS METAL DEPOSITION ON INTEGRATED CIRCUIT BOND PADS

(75) Inventors: Gonzalo Amador, Dallas, TX (US); Roger J. Stierman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 115 days.

(21) Appl. No.: 10/731,907

(22) Filed: Dec. 8, 2003

(65) Prior Publication Data

US 2004/0118693 A1     Jun. 24, 2004

Related U.S. Application Data

(62) Division of application No. 09/817,694, filed on Mar. 26, 2001, now abandoned.

(60) Provisional application No. 60/193,615, filed on Mar. 31, 2000.

(51) Int. Cl.
*H01L 21/66* (2006.01)

(52) U.S. Cl. .......................................... 438/17; 438/687
(58) Field of Classification Search ................ 438/10, 438/12, 17, 678, 687
See application file for complete search history.

(56) References Cited

U.S. PATENT DOCUMENTS

| 4,861,452 | A | 8/1989 | Stierman et al. |
| 5,340,437 | A | 8/1994 | Erk et al. |
| 5,830,805 | A | 11/1998 | Shacham-Diamand et al. |
| 6,042,712 | A | 3/2000 | Mathieu |
| 6,337,030 | B1 * | 1/2002 | Sakaguchi .................... 216/91 |
| 6,664,122 | B1 * | 12/2003 | Andryuschenko et al. ..... 438/17 |
| 6,811,675 | B1 * | 11/2004 | Chen ......................... 205/291 |
| 6,815,357 | B1 * | 11/2004 | Homma et al. ............. 438/695 |

* cited by examiner

*Primary Examiner*—Roy Potter
(74) *Attorney, Agent, or Firm*—Yingsheng Tung; Wade James Brady, III; Frederick J. Telecky, Jr.

(57) ABSTRACT

A method and an apparatus for uniform electroless plating of layers onto exposed metallizations in integrated circuits such as bond pads. The apparatus provides means for holding a plurality of wafers, and rotating each wafer at constant speed and synchronous within the plurality. Immersed in a plating solution flowing in substantially laminar motion and at constant speed, the method creates periodic superposition of directions and speeds of the motion of the wafers and the motion of the plating solution. The invention creates periodically changing wafer portions where the directions and speeds are additive and where the directions and speeds are opposed and subtractive. Consequently, highly uniformly layers are electrolessly plated onto the exposed metallizations of bond pads. If the plated layers are bondable metals, the process transforms otherwise unbondable pad metallization into bondable pads.

11 Claims, 2 Drawing Sheets

FIXTURE AND METHOD FOR UNIFORM ELECTROLESS METAL DEPOSITION ON INTEGRATED CIRCUIT BOND PADS

This is a divisional of application Ser. No. 09/817,694, filed Mar. 26, 2001 now abandoned, which claims priority from provisional application Ser. No. 60/193,615, filed Mar. 31, 2000.

FIELD OF THE INVENTION

The present invention is related in general to the field of semiconductor devices and processes and more specifically to a fixture and process for electroless plating bondable metal caps onto bond pads of integrated circuits having copper interconnecting metallization.

DESCRIPTION OF THE RELATED ART

In integrated circuits (IC) technology, pure or doped aluminum has been the metallization of choice for interconnection and bond pads for more than four decades. Main advantages of aluminum include ease of deposition and patterning. Further, the technology of bonding wires made of gold, copper, or aluminum to the aluminum bond pads has been developed to a high level of automation, miniaturization, and reliability. Examples of the high technical standard of wire bonding to aluminum can be found in U.S. Pat. No. 5,455,195, issued on Oct. 3, 1995 (Ramsey et al., "Method for Obtaining Metallurgical Stability in Integrated Circuit Conductive Bonds"); U.S. Pat. No. 5,244,140, issued on Sep. 14, 1993 (Ramsey et al., "Ultrasonic Bonding Process Beyond 125 kHz"); U.S. Pat. No. 5,201,454, issued on Apr. 13, 1993 (Alfaro et al., "Process for Enhanced Intermetallic Growth in IC Interconnections"); and U.S. Pat. No. 5,023,697, issued on Jun. 11, 1991 (Tsumura, "Semiconductor Device with Copper Wire Ball Bonding").

In the continuing trend to miniaturize the ICs, the RC time constant of the interconnection between active circuit elements increasingly dominates the achievable IC speed-power product. Consequently, the relatively high resistivity of the interconnecting aluminum now appears inferior to the lower resistivity of metals such as copper. Further, the pronounced sensitivity of aluminum to electromigration is becoming a serious obstacle. Consequently, there is now a strong drive in the semiconductor industry to employ copper as the preferred interconnecting metal, based on its higher electrical conductivity and lower electromigration sensitivity. From the standpoint of the mature aluminum interconnection technology, however, this shift to copper is a significant technological challenge.

Copper has to be shielded from diffusing into the silicon base material of the ICs in order to protect the circuits from the carrier lifetime killing characteristic of copper atoms positioned in the silicon lattice. For bond pads made of copper, the formation of thin copper (I) oxide films during the manufacturing process flow has to be prevented, since these films severely inhibit reliable attachment of bonding wires, especially for conventional gold-wire ball bonding. In contrast to aluminum oxide films overlying metallic aluminum, copper oxide films overlying metallic copper cannot easily be broken by a combination of thermocompression and ultrasonic energy applied in the bonding process. As further difficulty, bare copper bond pads are susceptible to corrosion.

In order to overcome these problems, a process has been disclosed to cap the clean copper bond pad with a layer of aluminum and thus re-construct the traditional situation of an aluminum pad to be bonded by conventional gold-wire ball bonding. A suitable bonding process is described in U.S. Pat. No. 5,785,236, issued on Jul. 28, 1998 (Cheung et al., "Advanced Copper Interconnect System that is Compatible with Existing IC Wire Bonding Technology"). The described approach, however, has several shortcomings.

First, the fabrication cost of the aluminum cap is higher than desired, since the process requires additional steps for depositing metal, patterning, etching, and cleaning. Second, the cap must be thick enough to prevent copper from diffusing through the cap metal and possibly poisoning the IC transistors. Third, the aluminum used for the cap is soft and thus gets severely damaged by the markings of the multiprobe contacts in electrical testing. This damage, in turn, becomes so dominant in the ever decreasing size of the bond pads that the subsequent ball bond attachment is no longer reliable.

A low-cost structure and method for capping the copper bond pads of copper-metallized ICs has been disclosed on U.S. patent application No. 60/183,405, filed on 18 Feb. 2000. The present invention is related to that application. The structure provides a metal layer plated onto the copper, which impedes the up-diffusion of copper. Of several possibilities, nickel is a preferred choice. This layer is topped by a bondable metal layer, which also impedes the up-diffusion of the barrier metal. Of several possibilities, gold is a preferred choice. Metallurgical connections can then be performed by conventional wire bonding.

It is difficult, though, to plate these bond pad caps uniformly in electroless deposition systems, because electroless deposition is affected by local reactant concentrations and by the agitation velocities of the aqueous solution. Deposition depletes the reactants in areas around the bond pads. Increasing the agitation of the solution only exacerbates the deposition non-uniformity, which is influenced by the flow direction of the solution. The problem is further complicated when a whole batch of wafers is to be placed simultaneously in order to reduce cost, since known control methods have been applied only to process single wafers under applied electrical bias. See, for example, U.S. Pat. No. 5,024,746, issued Jun. 18, 1991, and U.S. Pat. No. 4,931,149, issued Jun. 5, 1990 (Stierman et al., "Fixture and a Method for Plating Contact Bumps for Integrated Circuits").

An urgent need has arisen for a reliable method of plating metal caps over copper bond pads which combines minimum fabrication cost with maximum plating control of all layers to be deposited. The plating method should be flexible enough to be applied for different IC product families and a wide spectrum of design and process variations. Preferably, these innovations should be accomplished while shortening production cycle time and increasing throughput, and without the need of expensive additional manufacturing equipment.

SUMMARY OF THE INVENTION

The present invention discloses a method and an apparatus for uniform electroless plating of layers onto exposed metallizations in integrated circuits such as bond pads. The apparatus provides means for holding a plurality of wafers, and rotating each wafer at constant speed and synchronous within the plurality. Immersed in a plating solution flowing in substantially laminar motion and at constant speed, the method creates periodic superposition relative of directions and speeds of the motion of the wafers and the motion of the plating solution. The invention creates periodically changing wafer portions where the directions and speeds are additive and where the directions and speeds are opposed and subtractive. Consequently, highly uniformly layers are electrolessly plated onto the exposed metallizations of bond pads. If the plated layers are bondable metals, the process transforms otherwise unbondable bond pad metallization into bondable pads.

The present invention is related to high density and high speed ICs with copper interconnecting metallization, especially those having high numbers of copper metallized inputs/outputs, or "bond pads". These circuits can be found in many device families such as processors, digital and analog devices, logic devices, high frequency and high power devices, and in both large and small area chip categories.

It is an aspect of the present invention to be applicable to bond pad area reduction and thus to be in support of the shrinking of IC chips. Consequently, the invention helps to alleviate the space constraint of continually shrinking applications such as cellular communication, pagers, hard disk drives, laptop computers and medical instrumentation.

Another aspect of the invention is to deposit the bond pad metal caps by the self-defining process of electroless plating, thus avoiding costly photolithographic and alignment techniques.

Another aspect of the invention is to accomplish the control and stability needed for successful electroless metal deposition.

Another aspect of the invention is to advance the process and reliability of wafer-level multi-probing by eliminating probe marks and subsequent bonding difficulties.

Another object of the invention is to provide design and process concepts which are flexible so that they can be applied to many families of semiconductor products, and are general so that they can be applied to several generations of products.

Another object of the invention is to use only designs and processes most commonly employed and accepted in the fabrication of IC devices, thus avoiding the cost of new capital investment and using the installed fabrication equipment base.

These objects have been achieved by the teachings of the invention concerning selection criteria, process flows and controls suitable for mass production. Various modifications have been successfully employed to satisfy the requirements of different plating solutions.

In the first embodiment of the invention, an apparatus is disclosed for uniform electroless plating of layers onto exposed metallizations in integrated circuits, such as bond pads, which are positioned on the active surface of semiconductor wafers. The apparatus is suitable for simultaneous processing of a plurality of wafers. It provides rotation at constant speed synchronously to the wafers and thus creates relative motion, between the wafers and the chemical solution of a plating bath.

In the second embodiment of the invention, a plating apparatus is disclosed which combines the rotation of the wafers with the laminar motion at constant speed of the plating solution. The superposition of rotational and laminar motions and the resulting periodic changes of direction and speed create periodically changing wafer portions where the speeds are additive and where the speeds are subtractive. The resulting controlled electroless deposition of metal creates uniformly plated layers.

In all preferred embodiments, the various metal layers are deposited by electroless plating, thus avoiding the need for expensive photolithographic definition steps.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
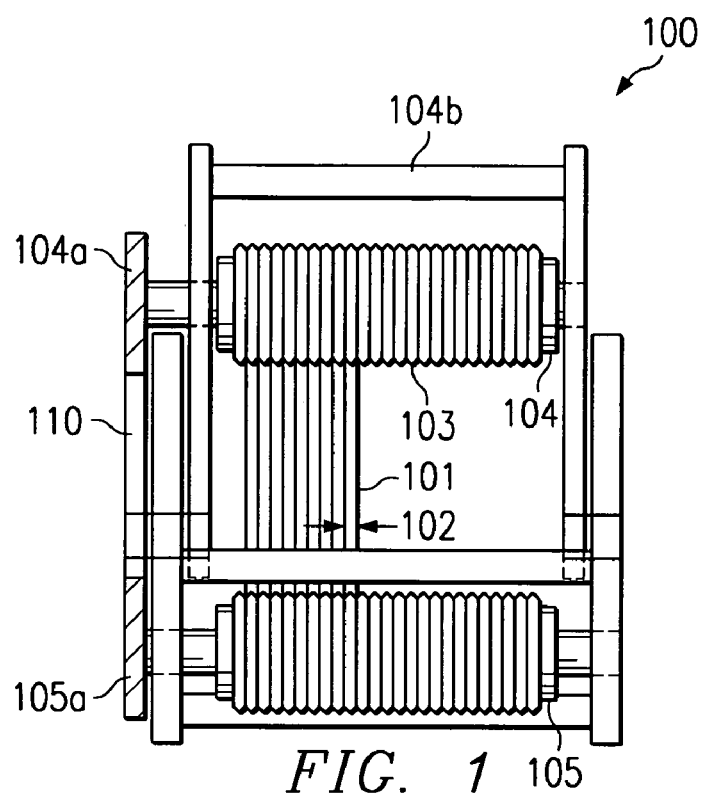
FIG. 1 is a schematic side view of the first embodiment of the invention, the apparatus for controlled electroless plating including a plurality of integrated circuit wafers.

Illustrating the first embodiment of the invention, generally designated 100, FIG. 1 shows a side view of the apparatus for controlled electroless plating of uniform metal layers onto exposed metallizations on a plurality of integrated circuit (IC) wafers 101. Usually, there are 10 to 30 wafers in a batch. In the fixture 100, the wafers 101 are held approximately parallel to each other at predetermined distances 102. A typical distance is in the range from about 5 to 10 mm and thus several times wider than the thickness of a wafer (about 0.25 to 0.75 mm). At their rims, the wafers are loosely held in grooves 103 of rollers. In FIG. 1, two rollers are shown, the bottom roller 105 and the capture roller 104. The rollers are made of chemically inert plastic material such as polypropylene. Instead of grooved rollers, toothed rollers may be used. A practical groove is about 2 to 5 mm deep. In the preferred embodiments, there are three rollers (see FIG. 2) employed to contain the wafers.

Figure 2:
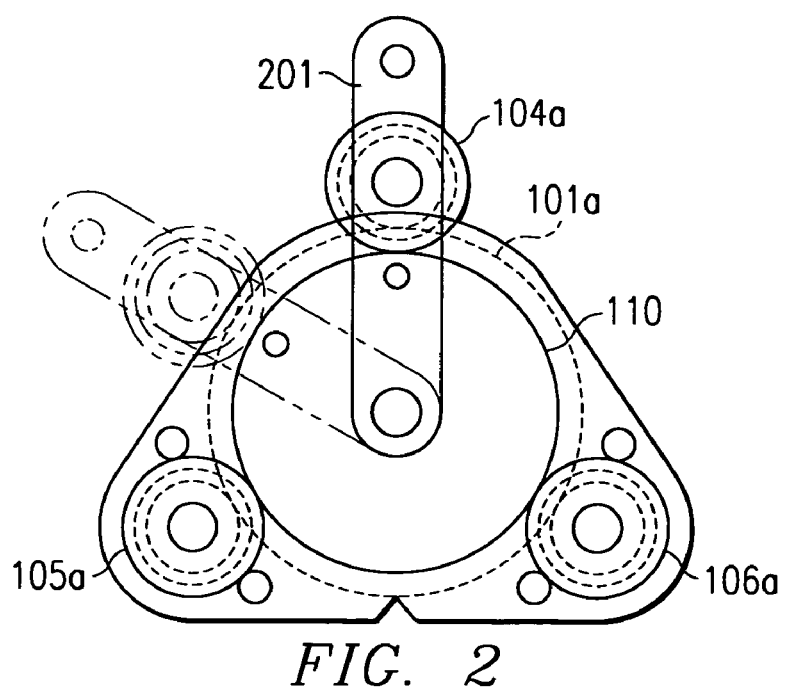
FIG. 2 is a schematic end view of the first embodiment of the invention, the apparatus for controlled electroless plating.

It is an essential feature of the invention that the rollers can be set in rotational motion by their respective driven gears 104a and 105a, which are driven by a central sun gear 110 (partially obscured in FIG. 1, but fully visible in FIG. 2). With this feature, the turning sun gear 110 drives all rollers at the same speed. Consequently, all wafers 101, contained in the roller grooves 103 and held in secure contact with the roller material by their weight, are rotating in unison at constant speed and in synchronous manner. For wafers of 200 mm diameter, preferred rotation speeds are in the range of about 0.5 to 5 rpm.

In FIG. 2, fixture 100 is displayed in a schematic end view. All three rollers are indicated by their respective driven gears 104a, 105a and 106a. The position of a 200 mm IC wafer is indicated by dashed line 101a. For practical ease of loading and unloading of the wafers, one of the rollers (in FIGS. 1 and 2, the capture roller 104) has a handle 104b fixed to a pivot arm 201 so that the roller 104 can be swung sidewise manually. In FIG. 2, the closed position is indicated by solid lines for pivot arm 201 and driven gear 104b, the opened position by dashed lines.

Figure 3:
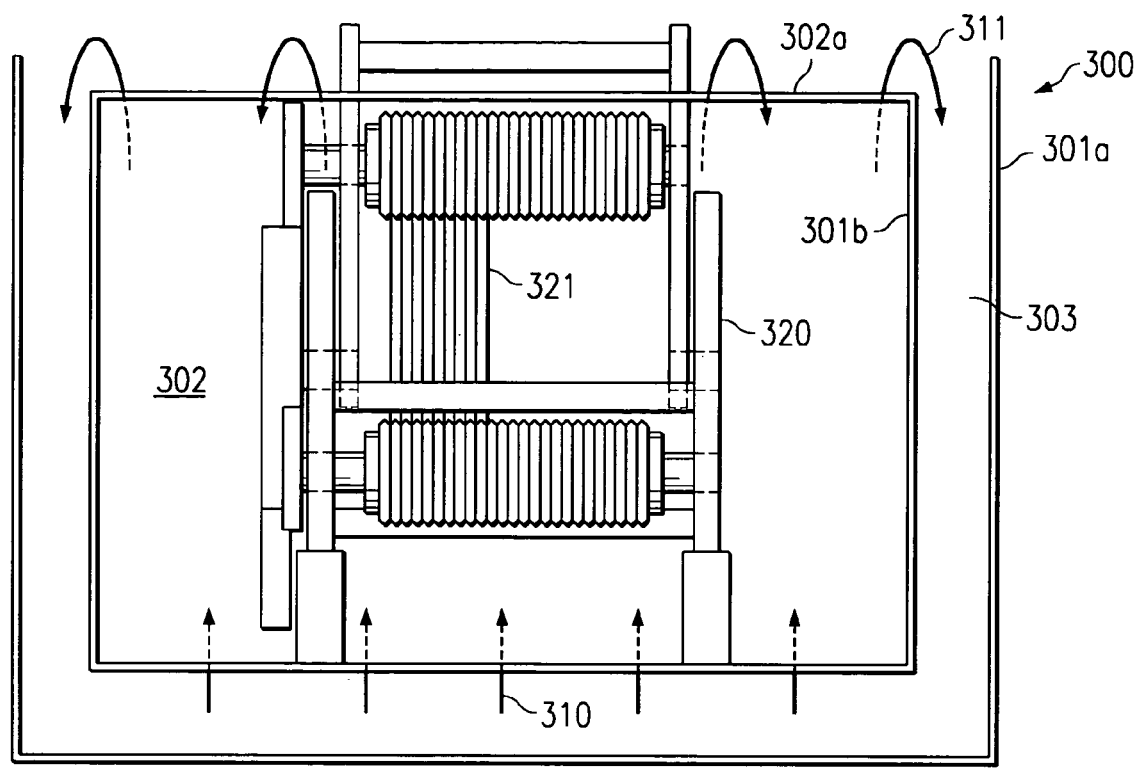
FIG. 3 is a schematic composite side view and cross section of the second embodiment of the invention, the plating tank and apparatus for controlled electroless plating.
Figure 4:
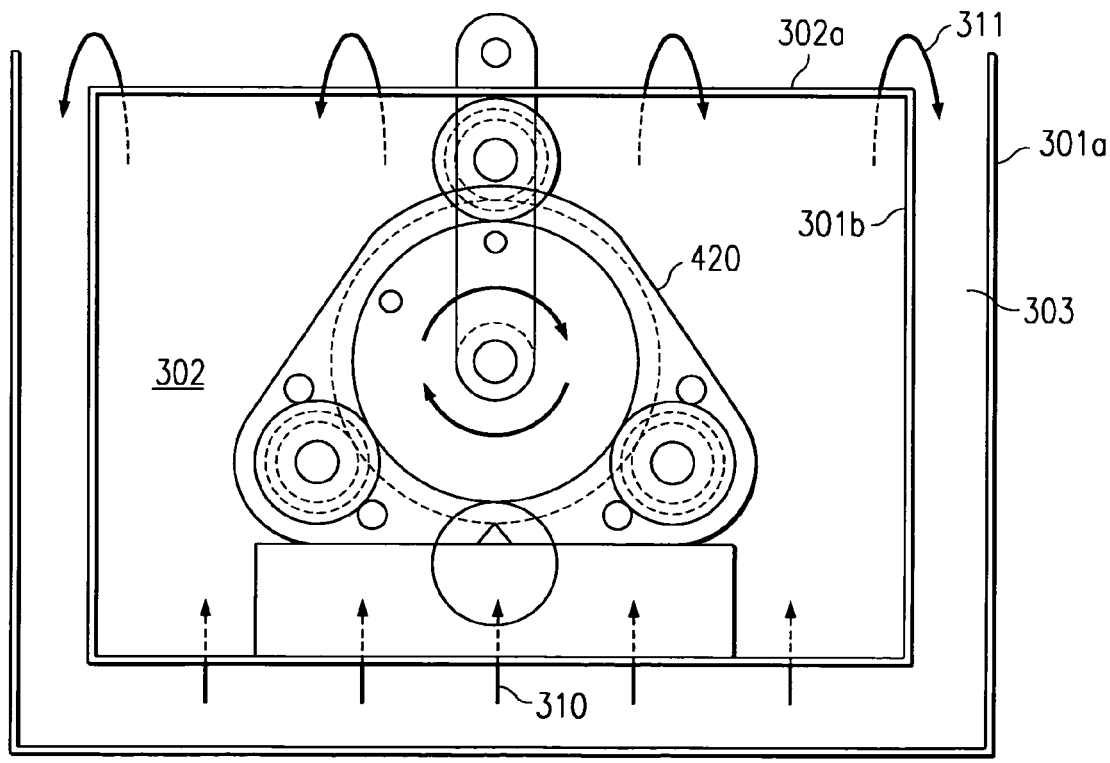
FIG. 4 is a schematic composite end view and cross section of the second embodiment of the invention, the plating tank and apparatus for controlled electroless plating.

Illustrating the second embodiment of the invention, generally designated 300, as well as the process for electroless plating, FIGS. 3 and 4 show schematically the cross section through a plating tank filled by the liquid plating solution 302 up to the surface 302a of the solution. The plating tank has an outer wall 301a and an inner wall 301b, separated by a gap 303, which enables the reflow of the liquid. In FIGS. 3 and 4, arrows indicate the flow of the liquid solution. As can be seen, the solution enters the tank from the bottom (arrows 310), moves in laminar flow at constant speed upward (for example, at a speed of 20 cm/min) through the tank, and exits from the tank surface (arrows 311) by overflowing into the reflow gap 303. After reaching the tank bottom, the flow cycle begins anew.

Further shown in FIGS. 3 and 4 is the apparatus/fixture for holding a plurality of wafers, explained in FIGS. 1 and 2. In FIG. 3, the fixture is illustrated in side view 320 as in FIG. 1; in FIG. 4, the fixture is illustrated in end view 420 as in FIG. 2. As can be seen from FIG. 3, the fixture is loaded with a batch of wafers 321, contained on their side edges while their active and passive surfaces covered by a protective resist are exposed to the plating solution (the passive surfaces are covered by a protective resist).

On its laminar flow from the bottom to the surface of the tank, the plating solution flows substantially parallel to the active surfaces of the wafers contained in the fixture. In order to control the electroless plating process and achieve uniform metal layer deposition, it is an essential feature of the present invention that the direction and speed of the laminarly moving solution is superposed by another relative motion. This additional relative motion is generated by the rotation at constant speed of the wafers held in the fixture (the fixture causes the wafers to move synchronously with each other). With this additional motion, a periodic superposition of directions and speeds is achieved between the motion of the wafers and the motion of the solution, resulting in periodically changing wafer portions where the directions and speeds are additive and where the directions and speeds are opposed and subtractive.

This periodic relative motion in changing directions between the plating solution and the rotating wafers is crucial for creating uniformly plated layers on exposed metallizations of the active wafer surfaces by controlled electroless deposition.

The preferred electroless process flow used for plating uniform metal layers as caps onto exposed copper metallizations such as bond pads of ICs positioned on the active surface of semiconductor wafers has the following steps. The example is chosen for fabricating a cap consisting of two metal layers.

Step 1: Coating the passive surface of the IC wafers with resist using a spin-on technique. This coat will prevent accidental metal deposition on the passive surface of the wafers.

Step 2: Baking the resist, typically at 110° C. for a time period of about 30 toe 60 minutes.

Step 3: Cleaning of the exposed bond pad copper surface using a plasma ashing process for about 2 minutes.

Step 4: Loading the wafers into the apparatus/fixture described above for controlled electroless plating.

Step 5: Cleaning by immersing the wafers, having the exposed copper of the bond pads, in a solution of sulfuric acid, nitric acid, or any other acid, for about 50 to 60 seconds.

Step 6: Rinsing in overflow rinser for about 100 to 180 seconds.

Step 7: Immersing the wafers in a catalytic metal chloride solution, such as palladium chloride, for about 40 to 80 seconds. This step "activates" the copper surface, i.e., a layer of seed metal (such as palladium) is deposited onto the clean non-oxidized copper surface.

Step 8: Rinsing in dump rinser for about 100 to 180 seconds.

Step 9: Initiating laminar motion at constant speed of first electroless plating solution in plating tank. If nickel is to be plated, the solution consists of an aqueous solution of a nickel salt, such as nickel chloride, sodium hypophosphite, buffers, complexors, accelerators, stabilizers moderators, and wetting agents.

Step 10: Immersing the wafers into the electroless plating solution. The solution, flowing in laminar motion at constant speed, flows substantially parallel to the active surface of the wafers.

Step 11: Initiating rotation of wafers at constant speed and synchronously with each other, initiating superposition of directions and speeds of the waver motion and the solution motion.

Step 12: Plating layer electrolessly. If a nickel layer is to be plated, plating between 150 and 180 seconds will deposit about 0.4 to 0.6 μm thick nickel layer.

Step 13: Stopping rotation of wafers.

Step 14: Removing wafers from plating solution.

Step 15: Rinsing in dump rinser for about 100 to 180 seconds.

Step 16: Repeating Steps 9 through 15 for second electroless plating solution, varying composition of solution and plating time according to metal-to-be-plated.

Step 17: Repeating Steps 9 through 15 for third electroless plating solution, varying composition of solution and plating time according to metal-to-be-plated.

Step 18: Stripping wafer protection resist from passive surface of wafers for about 8 to 12 minutes.

Step 19: Spin rinsing and drying for about 6 to 8 minutes.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention can be applied to IC bond pad metallizations other than copper, which are difficult or impossible to bond by conventional ball or wedge bonding techniques, such as alloys of refractory metals and noble metals. As another example, the invention applies to immersion plating and autocatalytic plating. A sequence of these plating techniques is particularly useful for electroless plating of gold layers. As another example, the invention provides for easy control of the uniformity of plated layers by modifying individually the flow speed of the plating solution or the rotation speed of the wafers, even in the course of one plating deposition. It is therefore intended that the appended claims encompass any such modifications or embodiments.

We claim:

1. A method of electroless plating of features on a semiconductor wafer, comprising the steps of:
   providing a plating apparatus with a plurality of rollers;
   swinging one of said plurality of rollers out of a firsst position, loading said wafer on the remaining rollers in said plurality, and then swinging said roller back into a second position;
   supporting said wafer with the plurality of rollers;
   rotating said wafer by rotating each of said plurality of rollers; and
   flowing plating solution over the surface of said wafer.

2. The method of claim 1, wherein said step of supporting comprises supporting said wafer in a groove in each of said rollers in said plurality.

3. The method of claim 1, wherein said step of rotating said wafer comprises turning a gear on each of said rollers by turning a central sun gear engaged with said gear on each of said rollers.

4. The method of claim 1, further comprising the step of immersing said wafer and said rollers in said plating solution.

5. The method of claim 4, wherein said step of immersing said wafer comprises immersing said wafer and said rollers in a tank and said step of flowing plating solution comprises flowing said solution from the bottom of said tank to the top of said tank.

6. A method of electroless plating of features on a semiconductor wafer, comprising the steps of:
   providing a plating apparatus with a plurality of rollers;
   swinging one of said plurality of rollers out of a first position, loading said wafer on the remaining rollers in said plurality, and then swinging said roller back into a second position;
   supporting said wafer with the plurality of rollers, each of said rollers having grooves for supporting an edge of said wafer;
   immersing said wafer in plating solution;
   rotating said wafer by rotating said rollers; and
   flowing plating solution over the surface of said wafer during said step of rotating said wafer.

7. The method of claim 6, wherein said step of rotating said wafer comprises turning a gear on each of said rollers by turning a central sun gear engaged with said gear on each of said rollers.

8. The method of claim 6, wherein said step of immersing said wafer comprises immersing said wafer and said rollers in a tank and said step of flowing plating solution comprises flowing said solution from the bottom of said tank to the top of said tank.

9. A method of processing semiconductor wafers, comprising the steps of:
   providing a processing tank having an inside portion for containing a liquid, an outside portion for containing liquid over-flown from the inside portion of the tank, and a bottom section of the processing tank communicating with the outside portion for recycling the liquid from the outside portion into the inside portion of the tank;
   loading a batch of wafers on rollers in the inside portion of the processing tank in a substantially vertical position;
   securing the batch of wafers with a capture roller;
   filling the inside portion of the processing tank with processing liquid;
   rotating the batch of wafers on the rollers;
   flowing the liquid from the bottom of the processing tank in a laminar flow manner and a constant laminar flow speed perpendicular to the axis of the rotation near the batch of wafers; and
   controlling the rotation speed of the batch of wafers and the flow speed of the liquid to maintain a periodical relative motion between the wafer surface and the processing liquid.

10. The method of claim 9, in which the possessing is plating a substantially uniform layer of metal on copper metal.

11. The method of claim 10, in which the layer of metal includes aluminum.

\* \* \* \* \*